United States Patent [19]
Komuro et al.

[11] Patent Number: 5,563,752
[45] Date of Patent: Oct. 8, 1996

[54] MAGNETIC RECORDING AND REPRODUCING DEVICE USING A GIANT MAGNETORESISTIVE FILM

[75] Inventors: Matahiro Komuro; Hiroyuki Hoshiya, both of Hitachi; Katsuya Mitsuoka, Fujisawa; Hiroshi Fukui, Hiratsuka; Hirotsugu Fukuoka, Odawara; Moriaki Fuyama, Hitachi, all of Japan

[73] Assignee: Hitachi, Ltd., Tokyo, Japan

[21] Appl. No.: 303,111

[22] Filed: Sep. 8, 1994

[30] Foreign Application Priority Data

Sep. 9, 1993 [JP] Japan .................................. 5-224705

[51] Int. Cl.$^6$ .................................................. G11B 5/39
[52] U.S. Cl. ................................................... 360/113
[58] Field of Search ............................................. 360/113

[56] References Cited

U.S. PATENT DOCUMENTS

| | | | |
|---|---|---|---|
| 5,159,513 | 10/1992 | Dieny et al. | 360/113 |
| 5,287,238 | 2/1994 | Baumgart et al. | 360/113 |
| 5,301,079 | 4/1994 | Cain et al. | 360/113 |
| 5,363,265 | 11/1994 | Hsie et al. | 360/113 |

FOREIGN PATENT DOCUMENTS

| | | |
|---|---|---|
| 0490608A2 | 6/1992 | European Pat. Off. . |
| 2-23681 | 1/1990 | Japan . |
| 2-61572 | 3/1990 | Japan . |

Primary Examiner—Robert S. Tupper
Attorney, Agent, or Firm—Pennie & Edmonds

[57] ABSTRACT

A magnetic recording and reproducing device using a giant magnetoresistive film for providing high detection sensitivity. In the giant magnetoresistive film comprising a conductive nonmagnetic film, first and second conductive ferromagnetic films, a magnetization fixing film for fixing a magnetization direction of the first ferromagnetic film, and a pair of electrodes for making a detection current flow, when no external magnetic field is received and no detection current flows, a magnetization direction of the second ferromagnetic film is made non-orthogonal to the magnetization direction of the first ferromagnetic film. Magnitude of the detection current is determined so that when no external magnetic field is received and detection current flows, they are orthogonal to each other upon receipt of a magnetic field due to the detection current.

6 Claims, 8 Drawing Sheets

PLANE FACING MAGNETIC DISK

MAGNETIC RECORDING AND REPRODUCING DEVICE USING A GIANT MAGNETORESISTIVE FILM

BACKGROUND OF THE INVENTION

1. Field of the Invention

This invention relates to a magnetic recording and reproducing system using a so-called giant magnetoresistive film, and in particular, to a magnetic recording and reproducing device having a high recording density.

2. Description of the Related Art

In the related art, a magnetic field sensor comprising at least two ferromagnetic thin films separated by an intermediate layer is described in Japanese Patent Laid-Open No. 2-61572. The magnetic field sensor is made of material with the magnetization directions of both the ferromagnetic thin films becoming antiparallel in one direction depending on whether or not the effect of an external magnetic field exists, and detects an external magnetic field at high sensitivity on the basis that electron scattering depending on the spin direction occurs on an interface between the ferromagnetic layer and the intermediate layer.

Also, a magnetoresistive element comprising a multilayered film comprising a ferromagnetic film having the magnetoresistance effect and a metal conductor thin film having high electric conductivity laminated on each other is described in Japanese Patent Laid-Open No. 2-23681.

Further, a magnetic sensor using a so-called giant magnetoresistive film comprising a first ferromagnetic film and a second ferromagnetic film between which a nonmagnetic layer is sandwiched is described in EP490608A2. The magnetization directions of the first and second ferromagnetic films of the giant magnetoresistive film are at right angles or orthogonal to each other when no external magnetic field is received (zero magnetic field). When an external magnetic field is received, a resistance change occurs on the giant magnetoresistive film because the first and second ferromagnetic films differ in magnetization rotation direction. To detect an external magnetic field, an electric current is made to flow into the giant magnetoresistive film for detecting a resistance change. The necessity of paying attention to the direction of the current flowing into the film at this time is described in EP490608A2.

Particularly, those skilled in the art focus on the magnetic sensor using the giant magnetoresistive film as described in EP490608A2 because it provides high detection sensitivity compared with conventional magnetic sensors using single layer magnetoresistive film.

As described above, the magnetic sensor using the giant magnetoresistive film as described in EP490608A2 provides high detection sensitivity compared with magnetic sensors using a single layer magnetoresistive film, but if an actual magnetic recording and reproducing device is constructed, a high detection sensitivity which is expected in theory, cannot be provided, and no practical machine has yet been implemented.

SUMMARY OF THE INVENTION

It is therefore an object of the invention to provide a magnetic recording and reproducing device using a giant magnetoresistive film having higher detection sensitivity than that was previously possible.

The inventors have examined the reason why a magnetic recording and reproducing device using a conventional giant magnetoresistive film is unable to provide sufficient detection sensitivity.

First, the basic structure and operation of a conventional giant magnetoresistive film will be simply discussed. The giant magnetoresistive film comprises a first ferromagnetic film and a second ferromagnetic film laminated with a nonmagnetic film positioned between them, an antiferromagnetic film laminated on the first ferromagnetic film, and a pair of electrodes for making a measurement current flow. The giant magnetoresistive film is supported on an appropriate substrate.

Each of the first and second ferromagnetic films and the nonmagnetic film is made of conductive material, and an electric current supplied from the electrode flows through the three films. The first and second ferromagnetic films are formed such that their magnetization directions are orthogonal to each other. The antiferromagnetic film and the first ferromagnetic film are coupled by a magnetic coupling force acting between the antiferromagnetic and ferromagnetic films, thereby fixing the magnetization direction of the first ferromagnetic film. On the other hand, the magnetization direction of the second ferromagnetic film rotates under the influence of a magnetic field of a record media.

Therefore, upon receipt of a magnetic field of a record media, the magnetization directions of the first and second ferromagnetic films become non-orthogonal, whereby the electrical resistance of the giant magnetoresistive film changes. This electrical resistance change is electrically detected by the current flowing from the electrode for detecting the magnetic field of record media. A ferromagnetic film having a large coercive force (hard magnetic film) can also be used in place of the antiferromagnetic film, for fixing the magnetization direction of the first ferromagnetic film.

The inventors have discovered that the reason why the conventional giant magnetoresistive film of such a basic structure cannot provide high detection sensitivity is that the current flowing through the giant magnetoresistive film causes the magnetization direction of the second ferromagnetic film to rotate, hindering the detection of the magnetic field of magnetic media.

Therefore, in the invention, to accomplish the object of providing a magnetic recording and reproducing device using a giant magnetoresistive film having high detection sensitivity, the magnetization direction of the second ferromagnetic film is made non-orthogonal to the magnetization direction of the first ferromagnetic film when no magnetic field of magnetic media is received and no detection current flows. Current strength setting means for determining the magnitude of the detection current is disposed, for determining the magnitude of the detection current so that a current magnetic field of the detection current flowing into the giant magnetoresistive film is set to such a magnitude as to cause the magnetization direction of the second ferromagnetic film, when the magnetic field of the magnetic disk is not received, to be orthogonal to the magnetization direction of the first ferromagnetic film.

The magnetization direction of the first ferromagnetic film can be made non-orthogonal to that of the second ferromagnetic film when a magnetic field of the magnetic disk is not received by controlling magnetic coupling between the first and second ferromagnetic films.

Here, the coupling action between the first and second ferromagnetic films of the giant magnetoresistive film is described. The coupling refers to a force acting between the first and second ferromagnetic films so as to align the mutual magnetization directions. If this force is represented by the magnetic field strength, it is called a coupling magnetic field.

The inventors have discovered that the coupling in the giant magnetoresistive film is represented by the combination of the following three phenomena. The first one is a magnetic coupling phenomenon occurring via the nonmagnetic film between the first and second ferromagnetic films. This coupling is determined by the material, thickness, and manufacturing process of the first and second ferromagnetic films, and the conductive film. The second is magnetostatic coupling between the first and second ferromagnetic films. This is the effect of a magnetic field leaked from the edges of the films and is determined by the amount of magnetization of the first and second ferromagnetic films, the thickness of the conductive film, and the form, and particularly the width, of the device.

The third is a phenomenon that the first and second ferromagnetic films undergo, caused by a magnetic field produced by a detection current flowing through the giant magnetoresistive film. The second ferromagnetic film is affected by the magnetic field produced by the detection current flowing through the giant magnetoresistive film and has the magnetization direction rotated as described above. The first ferromagnetic film is magnetically strongly coupled to the magnetization direction fixing film and the coupling between the first ferromagnetic film and the magnetization direction fixing film does not change by force received from a magnetic field produced by a current of $10^6$–$10^7$ A/cm$^2$ used in the magnetic recording and reproducing device using the giant magnetoresistive film. Thus, any effect that the magnetic field of the detection current has on the magnetization direction of the first ferromagnetic film can be almost ignored.

In the related art, existence of the third phenomenon and means for improving the detection sensitivity by considering the third phenomenon are not cleared.

In the invention, the coupling between the first and second ferromagnetic films is approximately represented as follows, by considering the three phenomena described above:

$$H_{total} = H_{mag} + H_{shunt} + H_{curr} \quad (1)$$

where $H_{total}$ is the total coupling magnetic field between the first and second ferromagnetic films, $H_{mag}$ is the magnetic coupling magnetic field caused by the first phenomenon described above, $H_{shunt}$ is the magnetostatic coupling magnetic field caused by the second phenomenon, and $H_{curr}$ is the coupling magnetic field produced by detection current caused by the third phenomenon.

According to the inventors, $H_{mag}$, $H_{shunt}$, and $H_{curr}$ are represented by the following expressions:

$$H_{mag} \propto J_{mag}/M_2 t_2 \quad (2)$$

$$H_{shunt} \propto -t_1/h_{MR} \times M_1 \times M_1 t_1/M_2 t_2 \quad (3)$$

$$H_{curr} \propto i(t_1+t_0) \quad (4)$$

where $J_{mag}$ is exchange energy between the first and second ferromagnetic films, $M_1$ and $M_2$ are the magnetic flux densities of the first and second ferromagnetic films respectively, $t_1$, $t_2$, and $t_0$ are the thicknesses of the first and second ferromagnetic film and the nonmagnetic film respectively, $h_{MR}$ is the width of the giant magnetoresistive film, and $i$ is the current density of detection current flowing through the giant magnetoresistive film.

In the invention, to make the magnetization directions of the first and second ferromagnetic films non-orthogonal when no magnetic field of a magnetic disk is received, and thus no detection current flows, the magnetic coupling between the first and second ferromagnetic films can be controlled by designing $J_{mag}$, $M_1$, $M_2$, $t_1$, $t_2$, $t_0$, and $h_{MR}$ so that $H_{total} = H_{mag} + H_{shunt} \neq 0$ is satisfied before the giant magnetoresistive film is manufactured.

To detect the magnetic field of a magnetic disk at high sensitivity in a magnetic recording and reproducing device using a giant magnetoresistive film, it is necessary to set $H_{total}$ to zero (make the magnetization directions of the first and second ferromagnetic films orthogonal to each other) when no magnetic field is received from the magnetic disk. Expression (1) mentioned above qualitatively represents the bias characteristic of the giant magnetoresistive film handled in the invention. That is, it indicates that detection current needs to be considered to set $H_{total}$ to zero (make the magnetization directions of the first and second ferromagnetic films orthogonal to each other). Therefore, in the invention, to detect a magnetic field at high sensitivity, with the bias characteristic $H_{total} = H_{mag} + H_{shunt} \neq 0$ (the magnetization directions of the first and second ferromagnetic films made orthogonal to each other) when zero or little detection current is energized, the detection current of such a magnitude as not to set $H_{total}$ to zero until the detection current is energized, is set by the current strength setting means.

The giant magnetoresistive film according to the invention has an output-magnetic field characteristic shifted when the current density of a detection current made to flow into the giant magnetoresistive film is changed. The characteristic shift is caused by a magnetic field produced by the current flowing through the giant magnetoresistive film as described above. Since the magnetic field produced by the detection current increases with the current density, the amount shift of the output-magnetic field characteristic also increases with the current density. Also, the magnetic field produced by the detection current varies depending on the current flow direction.

If the current direction is reversed, the shift direction of the output-magnetic field characteristic with respect to the magnetic field also reverses. Such a shift of the output characteristic depending on the current density occurs regardless of whether or not the magnetic coupling between the first and second ferromagnetic films is ferromagnetic or antiferromagnetic. The total coupling magnetic field becomes the sum total of the three coupling magnetic fields $H_{mag}$, $H_{shunt}$, and $H_{curr}$ as shown in Expression (1). The purpose of the invention is to set the sum total to zero.

To do so, the material, film thickness, form, and manufacturing process of the giant magnetoresistive film is controlled, thereby setting $H_{mag} + H_{shunt} \neq 0$ (making the magnetization directions of the first and second ferromagnetic films orthogonal to each other when neither detection current nor external magnetic field is applied). At this time, the value of $H_{mag} + H_{shunt}$ needs to be defined so as to cancel out the magnitude of $H_{curr}$ produced by the detection current. Thus, if the magnitude of the detection current is predetermined, it should be defined conforming to the magnitude of the detection current. For example, the density of current made to flow into the conventional giant magnetoresistive film is about $1 \times 10^6$ A/cm$^2$ or more and $H_{curr}$ becomes 1 Oe or more. Therefore, to use a detection current of about $1 \times 10^6$ A/cm$^2$ or more, $H_{mag} + H_{shunt}$ is set to 1 Oe or more or −1 Oe or less in response to the direction of making the detection current flow, whereby the sum total of the coupling magnetic fields can be set to zero.

The current energization direction may be changed depending on whether the magnetization directions of the first and second ferromagnetic films when not energized have antiparallel or parallel components relative to each other. That is, in response to whether the sign of the coupling magnetic field between the first and second ferromagnetic films when not energized is positive (a condition in which they have parallel components) or negative (a condition in which they have antiparallel components), the current energization direction is changed so as to generate a magnetic field in the direction of canceling out the coupling magnetic field.

DESCRIPTION OF THE PREFERRED EMBODIMENTS

Referring now to the accompanying drawings, they show preferred embodiments of the invention.

Figure 2:
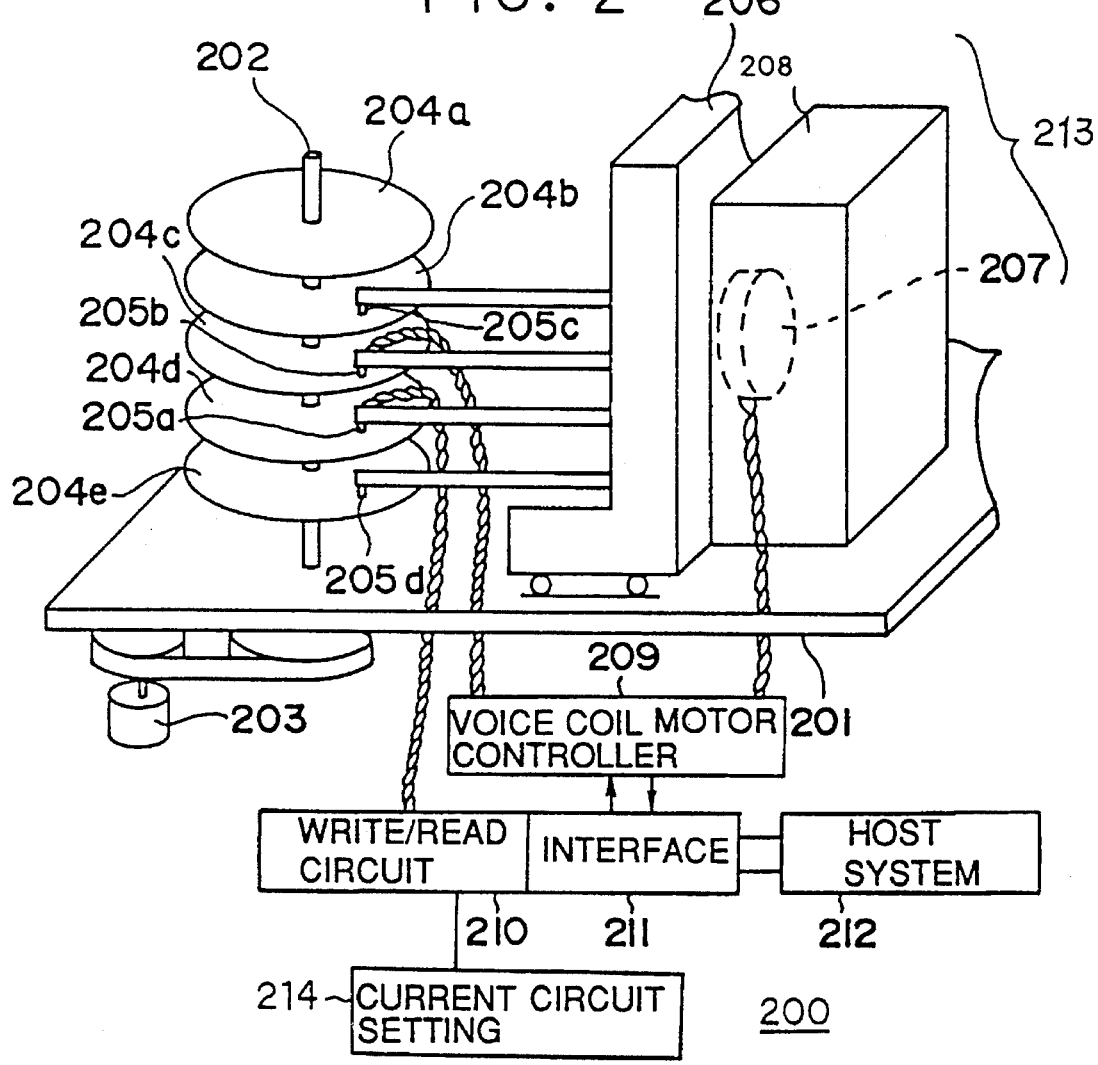
FIG. 2 is a block diagram showing the entire configuration of the magnetic recording and reproducing device in FIG. 1.

First, a magnetic disk unit 200 with magnetic heads using giant magnetoresistive films according to one embodiment of the invention is described with reference to FIG. 2, a perspective view showing the schematic structure of the magnetic disk unit 200.

The magnetic disk unit 200 comprises a spindle 202, a plurality of magnetic disks 204a, 204b, 204c, 204d, and 204e positioned on the spindle 202 at equal spacing, a motor 203 for driving the spindle 202, a movable carriage 206 for providing a linear actuator, a voice coil motor 213 for driving the carriage 206, and a base 201 for supporting the components. The voice coil motor 213 consists of a magnet 208 and a voice coil 207.

The magnetic disk unit 200 also comprises a voice coil motor controller 209 for controlling the voice coil motor 213 in response to a signal transferred from a host system 212 such as a magnetic disk controller.

It also comprises a write/read circuit 210 having a function of converting data transferred from the host system 212 into an electric current to be made to flow into the magnetic heads conforming to the write system and a function of amplifying data transferred from the magnetic disk 204, etc., and converting into a digital signal, a current setting circuit 214 being connected to the read circuit of the write/read circuit 210 for controlling an electric current flowing into the giant magnetoresistive films, and an interface 211 for connecting the write/read circuit 210, the voice coil motor controller 209, and the host system 212.

Next, the operation of the magnetic disk unit 200 will be discussed by taking a read operation as an example. When inputting a read command via the interface to the voice coil motor controller 209 from the host system 212, the voice coil motor controller 209 outputs a control current to the voice coil motor 213 for operating the carriage 206 to move the magnetic heads 205a, 205b, etc., to the positions of tracks on which the specified data is stored at high speed for accurate positioning. This positioning is performed by the positioning magnetic head 205b connected to the voice coil motor controller 209 for detecting and providing the position on the magnetic disk 204c and performing position control of the data magnetic head 205a. The motor 203 supported on the base 201 rotates the magnetic disks 204a, 204b, 204c, 204d, and 204e, each being 3.5 inches in diameter, mounted on the spindle 202.

Figure 1:
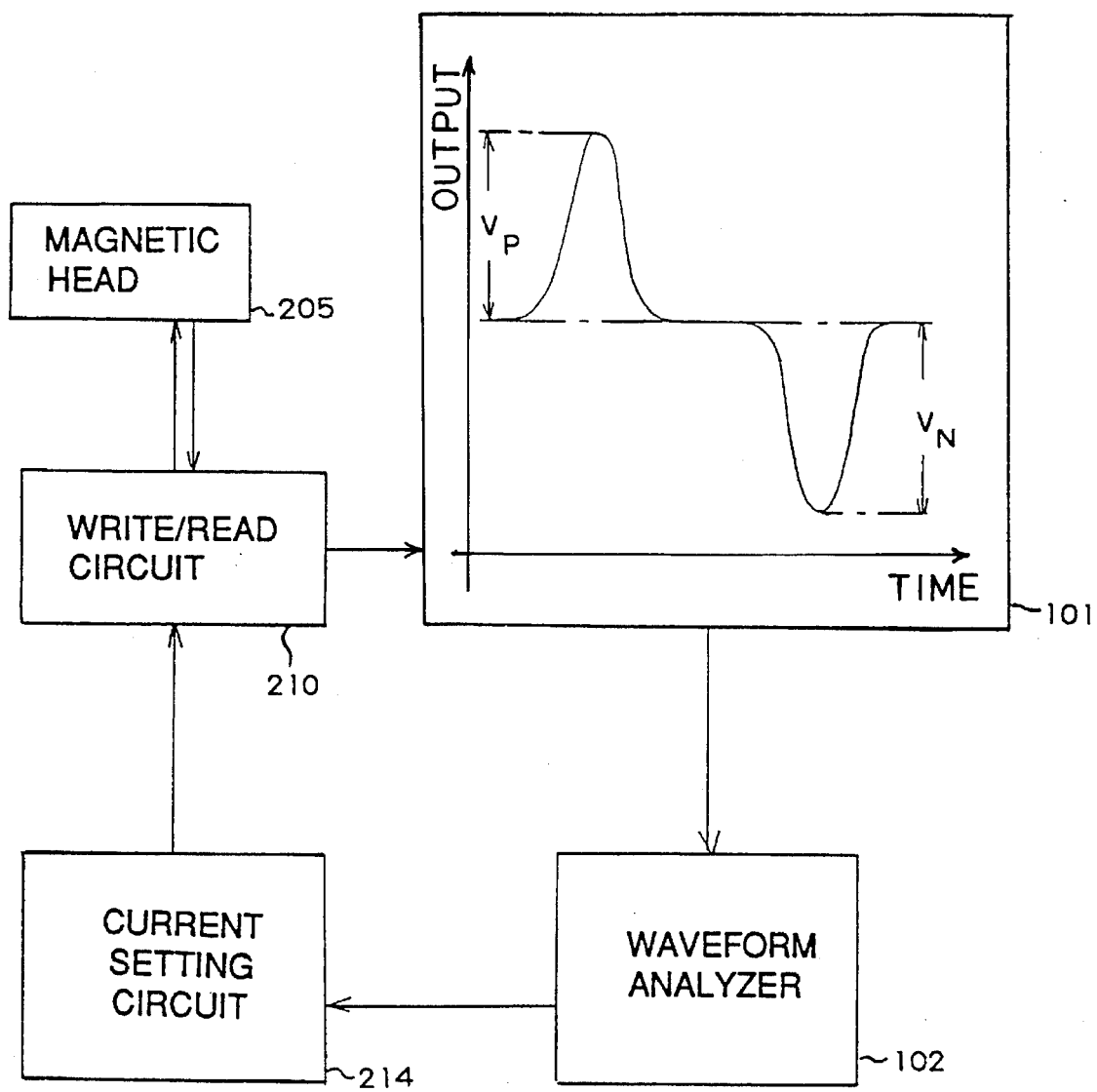
FIG. 1 is a block diagram showing a circuit for setting the magnitude of a detection current in a magnetic recording and reproducing device according to one embodiment of the invention.

Next, the specified magnetic head is selected in response to a signal from the write/read circuit 210 and the top position of the specified area is detected, then a data signal on the magnetic disk is read out by the data magnetic head 205a connected to the write/read circuit 210 for transferring signals to and from the magnetic disk 204a. At this time, a waveform analyzer 102 analyzes reproduced waveform 101 with respect to output and symmetry, as shown in FIG. 1. Based on the analysis values, a current setting circuit 214 sets an optimum current value for making a current of the optimum current value flow into the magnetic head through the write/read circuit 210. The waveform reproduced with the optimum current value can be again observed by the write/read circuit 210 and whether or not the output and symmetry satisfy the setup values can be again checked by the waveform analyzer 102. How to determine a setup current will be described below.

Next, magnetic heads using giant magnetoresistive films that can be used as the magnetic heads 205a to 205d of the magnetic disk unit 200 of the invention will be described.

Figure 5:
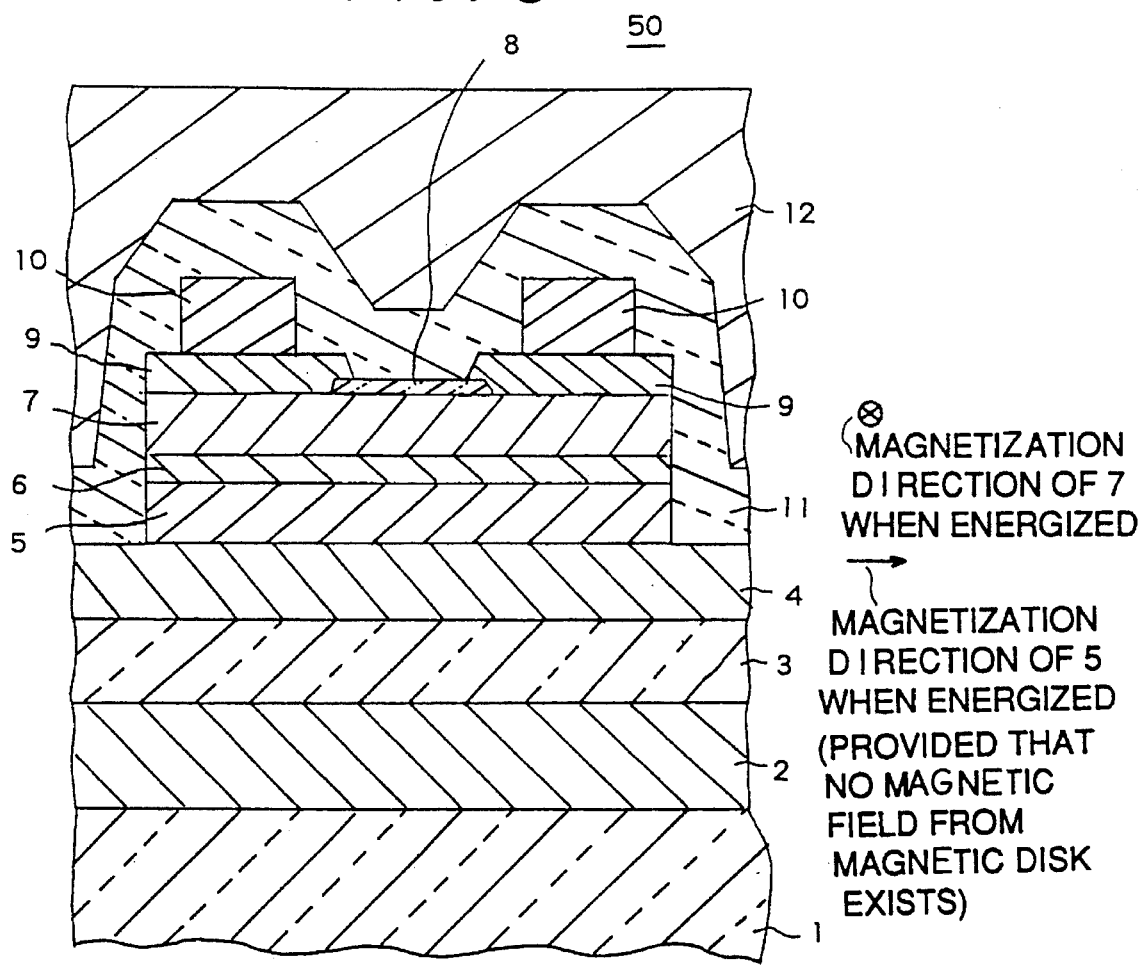
FIG. 5 is a sectional view showing the film structure of a magnetic head that can be used with the magnetic recording and reproducing device in FIG. 2.

FIG. 5 shows a magnetic head 50 using the giant magnetoresistive film according to the invention. FIG. 5 shows a sectional view of the magnetic head 50 when viewed from the plane facing magnetic disk.

The magnetic head 50 in FIG. 5 comprises a lower shield film 2, a lower gap film 3, an antiferromagnetic film 4, a first ferromagnetic film 5, a nonmagnetic film 6, and a second ferromagnetic film 7 laminated in order on a ceramic substrate 1 such as zirconia. An insulating film 8 is formed on the center of the second ferromagnetic film 7 and a pair of conductive antiferromagnetic films 9 are disposed on both sides of the insulating film 8. Further, an electrode film 10 is formed on each of the conductive antiferromagnetic films 9. An upper gap film 11 is laminated on the films so as to cover them, and further, an upper shield film 12 is laminated on the upper gap film 11. The giant magnetoresistive film comprises the antiferromagnetic film 4, the first ferromagnetic film 5, the nonmagnetic film 6, and the second ferromagnetic film 7.

In the present embodiment, the antiferromagnetic film 4, the first ferromagnetic film 5, the nonmagnetic film 6, the second ferromagnetic film 7, the insulating film 8, the conductive antiferromagnetic films 9, and the electrodes 10 are called together a giant magnetoresistive element.

Next, the functions and material of the films and layers will be discussed.

The upper and lower shield films 12 and 2 prevent any magnetic field, other than signals, from affecting the second ferromagnetic film 7, thus raising the signal resolution of the magnetic head 50; they are made of soft magnetic thin films of material such as an NiFe alloy, an NiCo alloy, or a Co family amorphous alloy, and each have a film thickness of about 0.5–3 μm.

The upper and lower gap films 11 and 3, contiguous to the upper and lower shield films 12 and 2, respectively isolate, electrically and magnetically, the giant magnetoresistive element from the upper and lower shield films 12 and 2; they are made of nonmagnetic insulators, such as glass, alumina, etc. The film thickness of each of the upper and lower gap films 11 and 3, which affects the reproduction resolution of the magnetic head 50, depends on the recording density desired for the magnetic disk unit, and normally lies in the range of 0.4–0.1 μm.

The film thickness of each of the conductive antiferromagnetic films 9 lies in the range of 5–10 nm; the conductive antiferromagnetic films use material such as an FeMn alloy or FeMnNi alloy.

The insulating film 8 determines the substantial spacing between the conductive antiferromagnetic films 9 and between the electrodes 10 on the second ferromagnetic film 7. The width of the insulating film 8 ranges from 0.1 to 10 μm. The insulating film 8 may be made of a material such as glass, alumina ($Al_2O_3$), silicon oxide ($SiO_2$), titania ($TiO_2$), hafnia ($HfO_3$), zirconia ($ZrO_2$), or carbon (C).

The first and second ferromagnetic films 5 and 7 are made of soft magnetic thin films of material such as an NiFe alloy, an NiCo alloy, or a NiFeCo alloy, each having a film thickness of about 1–10 nm. The portion of the second ferromagnetic film 7 just below the insulating film 8 is called a magnetic sensing portion for reading magnetic signals from a magnetic disk.

The nonmagnetic film 6 sandwiched between the first and second ferromagnetic films 5 and 7 has a film thickness of 1–5 nm and is made of a material such as Cu, Au, or Ag. The electrode films 10 are normally made of thin films of material such as Cu, Au, Nb, Cr, or Ta having small electrical resistance to enable sufficient current, for example, $1\times10^6$ to $1\times10^8 A/cm^2$, to flow into the first and second ferromagnetic films 5 and 7.

The antiferromagnetic film 4 is made of antiferromagnetic nickel oxide (NiO) or a CoPt ferromagnetic film having the coercive force 20 Oe or more, due to its stability for an external magnetic field, blocking temperature, and ease of manufacturing.

A detection current supplied from the electrode 10 flows via the antiferromagnetic film 9 through the three films of the first ferromagnetic film 5, the nonmagnetic film 6, and the second ferromagnetic film 7. The antiferromagnetic film 4 and the first ferromagnetic film 5 are coupled by a magnetic coupling force acting between the films 4 and 5, and the magnetization direction of the first ferromagnetic film 5 is fixed by the coupling. On the other hand, the magnetization direction of the second ferromagnetic film 7 is not fixed and thus rotates upon receipt of a magnetic field of a magnetic disk.

The second ferromagnetic film 7 is formed so that the magnetization direction of the second ferromagnetic film 7 becomes orthogonal to the first ferromagnetic film 5 upon receipt of a magnetic field caused by the current flowing from the electrode 10. The magnetization direction of the second film 7 becomes non-orthogonal to the first film 5 when no current flows and a magnetic field of a magnetic disk is not received.

Therefore, as shown in FIG. 1, upon receipt of the magnetic field of a magnetic disk when current flows, the magnetization directions of the first and second ferromagnetic films 5 and 7 become non-orthogonal, whereby the electric resistance of the giant magnetoresistive element changes. This electric resistance change is detected by the write/read circuit 210 for detecting the magnetic field of magnetic disk.

To make the magnetization directions of the first and second ferromagnetic films 5 and 7 non-orthogonal at a necessary angle to each other, when the magnetic field of magnetic disk is not received and the current is not made to flow from the electrode 10, the component material, film thickness, and form are previously calculated using Expressions (1), (2), (3), and (4) mentioned above, and based on these, the magnetic head is manufactured.

The coupling magnetic field of the first ferromagnetic film 5 and the second ferromagnetic film 7 must be set in order to determine the magnetic directions of the films 5 and 7, respectively. The coupling magnetic field value is set by the approximate detected current density.

Figure 11:
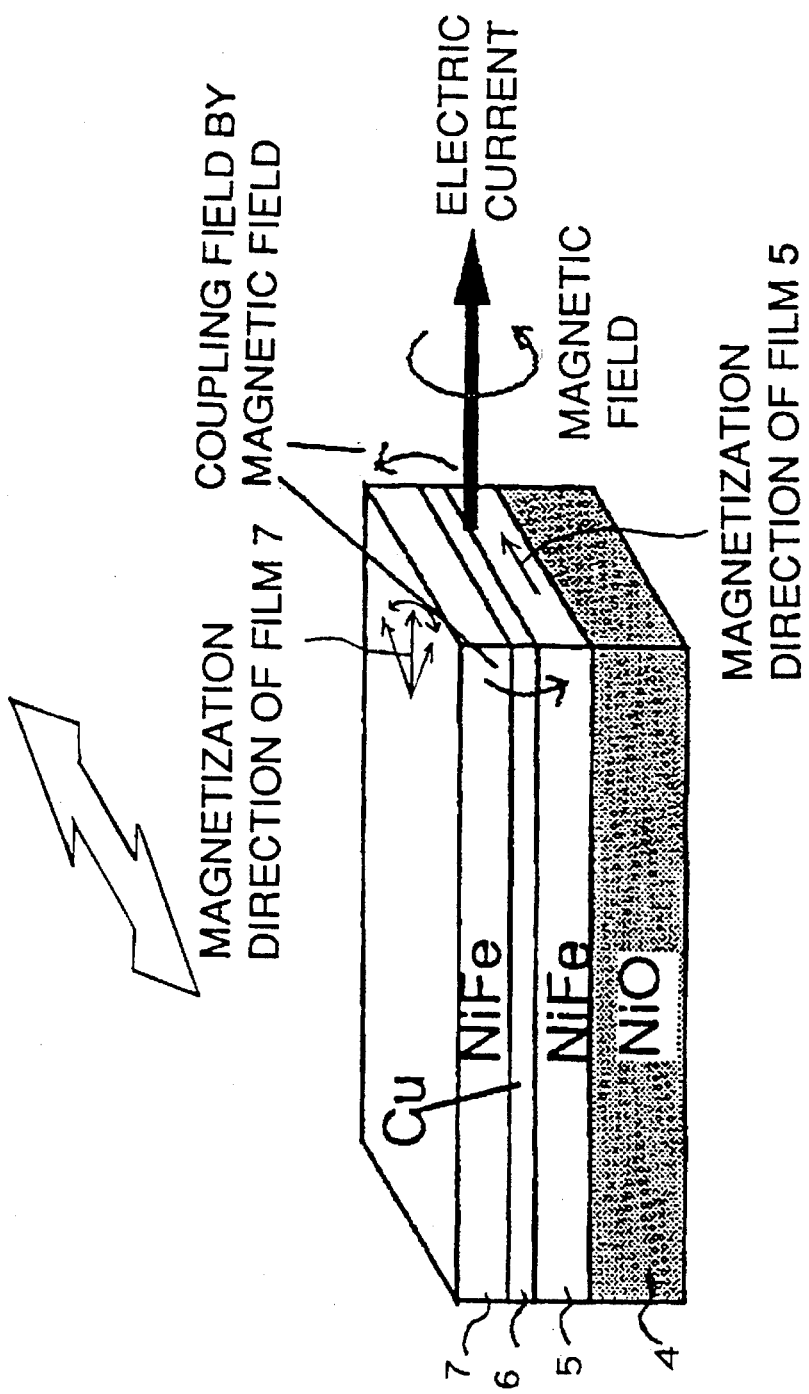
FIG. 11 is an illustration showing a magnetic field applied to the giant magnetoresistive element of the magnetic head in FIG. 5 and magnetization directions thereof.

The coupling between the first and second ferromagnetic films 5 and 7 of the giant magnetoresistive element is represented by the relationship using Expressions (1) to (4) described above. Therefore, the coupling magnetic field value when the magnetic field is zero varies depending on the current density of the detection current. If the magnetic head of the embodiment is energized, and the output-magnetic field curve is observed, it is seen that the output-magnetic field curve shifts depending on the current density value because of a bias magnetic field produced by the current. That is, as shown in FIG. 11, the current flowing through the giant magnetoresistive element causes a magnetic field to occur and the magnetic field produces the bias effect. Since the giant magnetoresistive film shown in FIG. 11 has the antiferromagnetic film 4 made of an insulator of NiO, current flows through the first ferromagnetic film 5, the nonmagnetic film 6, and the second ferromagnetic film 7, but the bias effect is produced as the antiferromagnetic film 4 is made of a conductive material.

Therefore, if the giant magnetoresistive film is formed so that the coupling between the first and second magnetic films measured without energization becomes zero, as formerly described, a current bias is added by energization, and output symmetry viewed from the zero magnetic field deteriorates, and when the current density becomes high, the magnetic field sensitivity of output near the zero magnetic field also decreases. Since the density of current made to flow into a magnetoresistive film of a magnetoresistive head is normally $1 \times 10^6 \text{A/cm}^2$ or more, preferably the coupling magnetic field between ferromagnetic films when not energized is made about 1 Oe that is the coupling magnetic field produced by a current of $1 \times 10^6 \text{A/cm}^2$ or more. The film thickness and crystal orientation of each of the films making up the magnetoresistive film need to be controlled in response to the value of the current density to be used for setting the value of the coupling magnetic field.

Thus, the magnetic head of the embodiment needs to be formed so that the coupling between the first and second ferromagnetic films 5 and 7 is not zero (the magnetization directions are non-orthogonal), when the magnetic head is not energized and a magnetic field of a magnetic disk is not received. That is, the magnetic head should be designed so that the magnetization directions of the first and second ferromagnetic films 5 and 7 have parallel or antiparallel components with respect to each other.

The manufacturing method of the magnetic head 50 will be discussed. The thin film forming method and the patterning method described below use sputtering, etching, and photo-lithography processes.

First, an NiFe alloy is formed to a thickness of 2 μm for making the lower shield film 2, then alumina is formed to a thickness of 0.3 μm for making the lower gap film 3 on the NiFe alloy (lower shield film 2). The ends of the lower shield film 2 are processed so as to be inclined with respect to the substrate face, in order to prevent the electrodes 10 which cover portions of the ends of the lower shield film 2 from being broken at the ends of the lower shield film 2.

Next, antiferromagnetic film or high coercive ferromagnetic film 4 is formed to a thickness of 2–100 nm on the lower gap film 3. The first ferromagnetic film 5, magnetically coupled to the film 4 and the nonmagnetic film 6, and the second ferromagnetic film 7 are formed on the film 4. The first and second ferromagnetic films 5 and 7 are coupled ferromagnetically (in a condition having parallel components to each other) or antiferromagnetically (in a condition having antiparallel components).

The nonmagnetic insulating film 8 is formed on the second ferromagnetic film 7 by an ion milling process. The conductive antiferromagnetic films 9 are produced on both ends of the nonmagnetic insulating film 8 by a sputtering process, and the first ferromagnetic film 5, the nonmagnetic film 6, the second ferromagnetic film 7, and the conductive antiferromagnetic film 9 are processed in a batch, as shown in FIG. 5. After this, the electrodes 10 are each formed as a bilayer film of gold and titanium, then processed, and further alumina is formed to a thickness of 0.3 μm, for making the upper gap film 11 on the electrodes 10, and alumina is formed as a protective film for completing the manufacturing of the magnetic head 50.

Now, how the current setting circuit 214 determines an optimum current density on the basis of the result of the waveform analyzer 102 is described.

In the present embodiment, a reference track on which a reference signal is recorded is provided as a part of the magnetic disk. The current setting circuit 214 sets a plurality of current densities predetermined within a range of $1 \times 10^6$ to $1 \times 10^8 \text{ A/cm}^2$, for the write/read circuit 210. The waveform analyzer 102 analyzes the reproduced waveform of the reference signal recorded on the magnetic disk by detecting the peak value of the output in the positive direction $V_P$ and that in the negative direction $V_N$, as shown in FIG. 1. The waveform analyzer 102 selects such a current density, from the current densities set by the current setting circuit 214, that the peak values in the positive direction and in the negative direction show a good symmetry, the $V_P$ and $V_N$ indicate high value, and a change with time is little, and indicates the selected current density to the current setting circuit 214 as an optimum current density. The current setting circuit 214 sets the optimum current density on the write/read circuit 210. The waveform analyzer 102 evaluates the symmetry of the $V_P$ and $V_N$ based on if the absolute values of $V_P$ and $V_N$ are equal or substantially the same.

Figure 3:
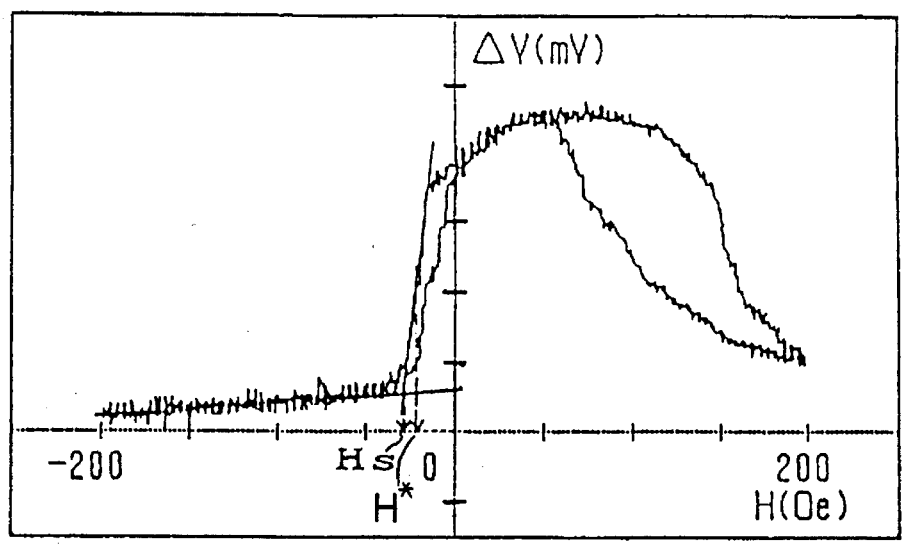
FIG. 3 is a graph showing the magnetic-field-to-output relationship of a magnetic head of the magnetic recording and reproducing device in FIG. 2.

The giant magnetoresistive element of the magnetic head 50 is located in a uniform AC magnetic field and a change in the obtained electrical resistance value is measured as an output (voltage ΔV). FIG. 3 shows the measurement results.

Figure 4:
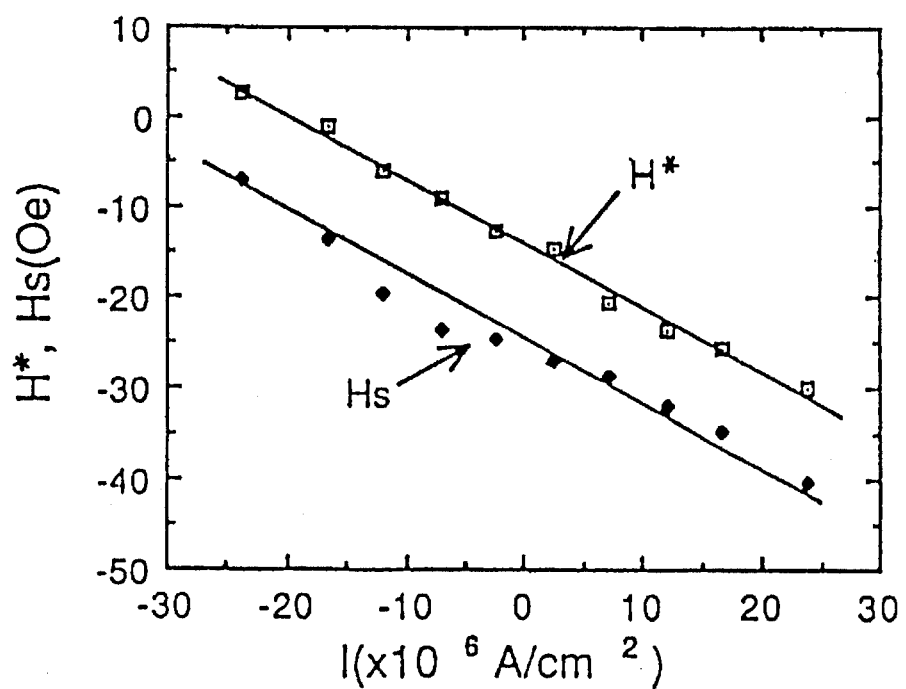
FIG. 4 is a graph showing change of magnetic characteristic when detection current of the magnetic head of the magnetic recording and reproducing device in FIG. 2 is changed.

Assume that in the output (ΔV)-magnetic field (H) curve in FIG. 3, the magnetic field at the middle point of the linear portion where the inclination of ΔV to the magnetic field becomes maximum is H* and that the magnetic field in the intersection of an extension to the linear portion and the base line is Hs. FIG. 4 shows H* change and Hs change when the density of current supplied from the electrode 10 is changed. As shown in FIG. 4, H* and Hs change substantially linearly with the current density. This shows that the output (ΔV)-magnetic field (H) curve as shown in FIG. 3 shifts together with the current density.

Also, it can be seen that when the current polarity is changed, the values of both H* and Hs shift in the opposite direction and are proportional to the current density. The relationship as shown in FIG. 4 can be explained with a bias magnetic field produced by detection current. From the result, H* and Hs can be controlled by setting the current density to an appropriate value. With the magnetic head of the embodiment, when the giant magnetoresistive element is not energized, H* is −13 Oe, indicating that the magnetization directions of the first and second ferromagnetic films 5 and 7 have components that are antiparallel to each other. When an electric current of $-2 \times 10^7 \text{ A/cm}^2$ is applied to the giant magnetoresistive film, H* becomes substantially zero; if the reproduced waveform is examined at this current density, a waveform having good symmetry, as shown in FIG. 1, is provided. Therefore, the optimum current value of the giant magnetoresistive film is $-2 \times 10^7 \text{ A/cm}^2$. As mentioned above, such setting of the current density is performed using the circuitry in FIG. 1 with the reference signal previously recorded on the magnetic disk. The waveform analyzer 102 provides waveform height $V_P$ and $V_N$ using a well-known signal processor, such as a 2-level slicer.

If the H* value when the magnetic head is not energized is +1 Oe or more, unlike that in FIG. 4, the optimum current value becomes $1 \times 10^6 \text{A/cm}^2$ or more. Even if magnetic heads are manufactured from the same wafer, the H* value may vary, but the current density can be set to a proper value from an analysis of the reproduced waveform for each magnetic head by the current setting circuit installed in the magnetic disk unit as described above. Since H* and Hs are reflected on the reproduced waveform shown in FIG. 1, output ($V_P$ and $V_N$), base line, noise, etc., of the reproduced waveform change with the current density. By analyzing the reproduced waveform, output, magnetic sensitivity of the output, and symmetry of the waveform become appropriate at one current density.

The character of the mentioned magnetic head 50 will be described again.

For the magnetoresistive film having the above-mentioned structure, the output-magnetic field characteristic at high current density shifts in relation to the magnetic field, compared with that at low current density. Thus, to obtain high output, the shift amount needs to be previously considered to set the film structure. That is, to obtain a high-output reproduced waveform with good symmetry, the total film thickness of the conductive film and two ferromagnetic films formed with the conductive film between may be set to a value previously shifted by a shift amount estimated from the value of current density to be used. Therefore, on the magnetization curve of sheet film of antiferromagnetic film used in the invention, two ferromagnetic films indicate antiferromagnetic or ferromagnetic coupling in zero magnetic field, and the current direction is changed depending on the antiferromagnetic or ferromagnetic coupling therebetween while output symmetry is raised by a magnetic field produced by an electric current in the setup current value of the current setting circuit. The antiferromagnetic coupling will represent a condition in which the magnetization directions of the two ferromagnetic films have antiparallel components. The ferromagnetic coupling will represent a condition in which the magnetization directions of the two ferromagnetic films have components parallel to each other.

In the magnetic head according to the embodiment, the antiferromagnetic films 9 are placed between the second ferromagnetic film 7 and the electrodes 10 in order to suppress movement of a magnetic wall other than at the magnetic sensing portion. The length of the magnetic sensing portion, namely, the track width is determined by the space of the portion not in direct contact with the second ferromagnetic film 7 between the pair of antiferromagnetic films 9. In the embodiment, the track width is determined by forming the insulating film 8. When the insulating film 8 is formed, it acts to prevent the second ferromagnetic film 7 and the antiferromagnetic film 9 from forming direct magnetic exchange coupling. In the areas in which the second ferromagnetic film 7 is in direct contact with the antiferromagnetic films 9, a bias magnetic field can be applied between the second ferromagnetic film 7 and the antiferromagnetic films 9 for suppressing occurrence of a magnetic wall in the second ferromagnetic film, thus Barkhausen noise caused by irregular movement of a magnetic wall can be suppressed. Further, the insulating film 8 causes an electric current supplied from the electrodes 10 to flow only into the magnetic sensing portion.

Preferably, the face recording density on magnetic disk is 50 megabits or more per square inch, the track recording density is 25 kilobits or more per inch, and the track density is 2000 tracks or more per inch as a high-performance magnetic disk unit. The magnetic head 50 using the giant magnetoresistive film does not produce a magnetic wall. As a result, it does not generate Barkhausen noise and has high sensitivity compared with a magnetoresistive film of a ferromagnetic single layer. Therefore, the heads can be used to manufacture a magnetic disk unit having a recording density of 600 megabits or more per square inch.

In the invention, the insulating film 8 which is thinner than the antiferromagnetic films 9 or the electrodes 10 is used to determine the track width. To perform the magnetic function as described above, or to maintain the effect of the electrodes with small resistance, the antiferromagnetic films 9 and the electrodes 10 have a minimum predetermined thickness, and cannot be made any thinner. If thick antiferromagnetic films 9 and thick electrodes 10 are processed by a lift-off process or collimator sputter, the process accuracy deteriorates as the film thickness becomes thicker. Since the insulating film 8 was not formerly used, it was difficult to process the track width accurately. In the invention, the insulating film 8 which is thinner than the antiferromagnetic films 9 or the electrodes 10 is disposed, and easily and accurately processed for determining the track width, so that the track width can be formed at high accuracy.

Figure 8:
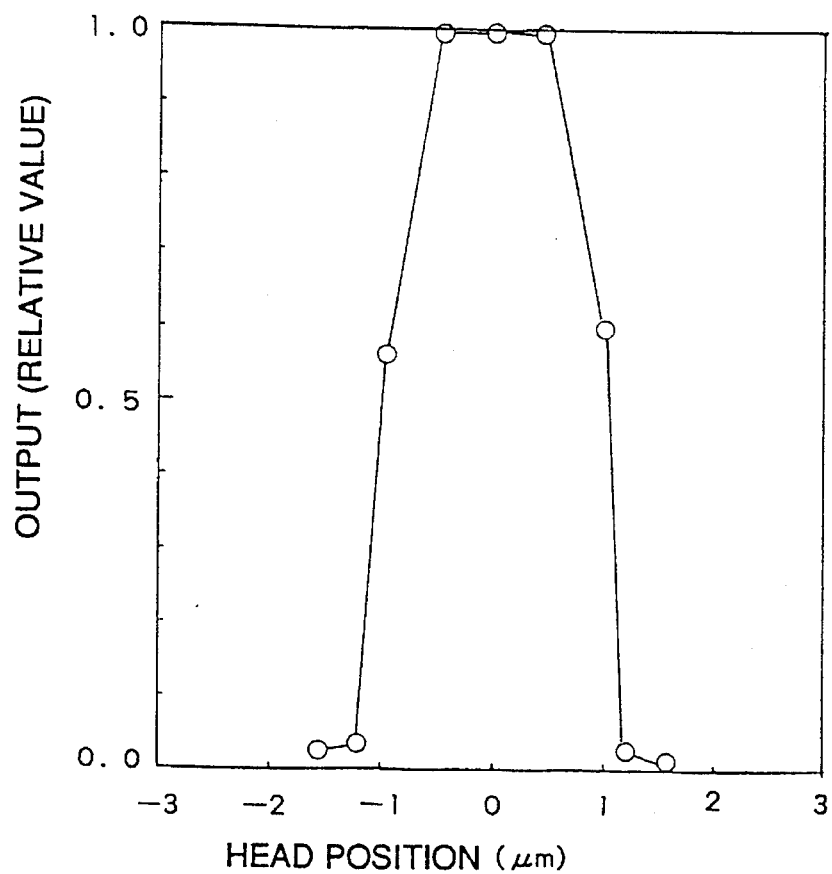
FIG. 8 is a graph showing the off-track characteristic of the magnetic head in FIG. 5.

FIG. 8 shows the off-track characteristic of the magnetic head 50 of the embodiment. To find the off-track characteristic, a 0.3-μm microtrack is written onto a magnetic disk and while it is reproduced by the magnetic head 50, the head position is shifted in the radius direction and output values are read. Head output becomes a value provided by integrating the output values in the head position direction. In the embodiment, the track width is made 1.5 μm, thereby providing the characteristic as shown in FIG. 8, indicating that the sensitivity distribution in the magnetic sensing portion is uniform.

Thus, the magnetic disk unit of the embodiment sets the magnitude of detection current so that when neither detection current nor external magnetic field is applied, the magnetization directions of the first and second ferromagnetic films are made non-orthogonal and so that when setup detection current is made to flow with no external magnetic field applied, the magnetization directions are made orthogonal to each other, whereby lowering of the detection sensitivity caused by the magnetic field strength produced by the detection current can be prevented and therefore an external magnetic field (magnetic field of a magnetic disk) can be detected at high sensitivity.

If a head of the structure according to the embodiment is used, high detection sensitivity is provided because of the highly accurate track width.

Also, a method of easily manufacturing magnetic heads with the highly accurate track width can be provided.

Figure 6:
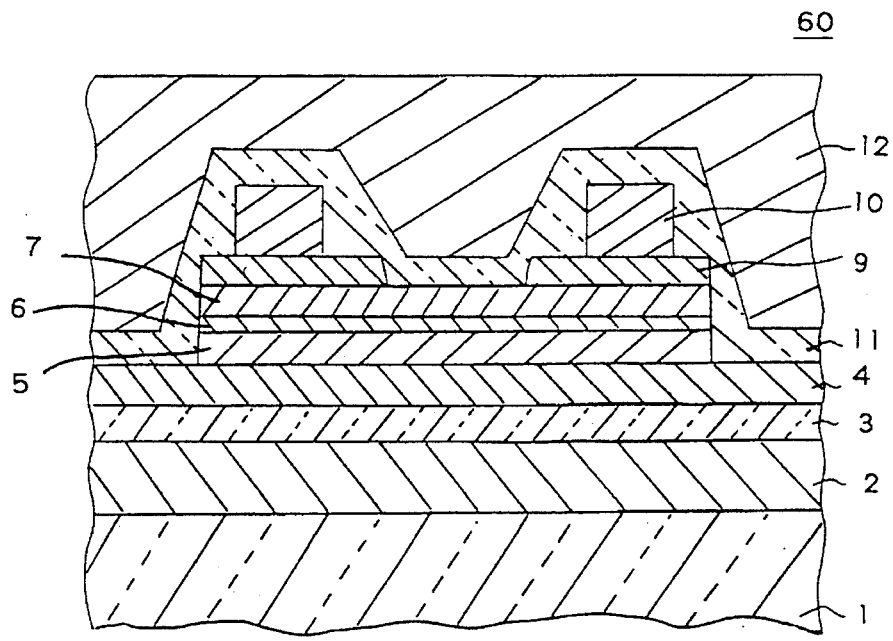
FIG. 6 is a sectional view showing the film structure of another magnetic head that can be used with the magnetic recording and reproducing device in FIG. 2.

FIG. 6 is an enlarged view of a sectional view of a magnetic head 60 using a giant magnetoresistive film according to another embodiment of the invention, when viewed from the plane facing the magnetic media. The magnetic head 60 in FIG. 6 does not use the nonmagnetic insulating film 8 for determining the track width, as in the magnetic head 50 in FIG. 5; the track width is determined by the space between antiferromagnetic films 9 in the magnetic head 60. Parts identical with those previously described with reference to FIG. 5 are denoted by the same reference numerals in FIG. 6 and will not be discussed again.

Electrodes 10 are each made of a bilayer film of gold and titanium (not shown) and alumina is formed to a thickness of 0.3 μm to make an upper gap film 11 on the electrodes 10, and an upper shield film 12 is formed for preparing the magnetoresistive head 60. In FIG. 6, the antiferromagnetic films 9 are formed using a collimator sputter process after a mask for lift-off process is formed.

A magnetic head 70 using a giant magnetoresistive film according to still another embodiment of the invention will be described with reference to FIG. 7, a sectional view of the magnetic head 70 cut on a plane vertical to the plane facing magnetic disk.

Figure 7:
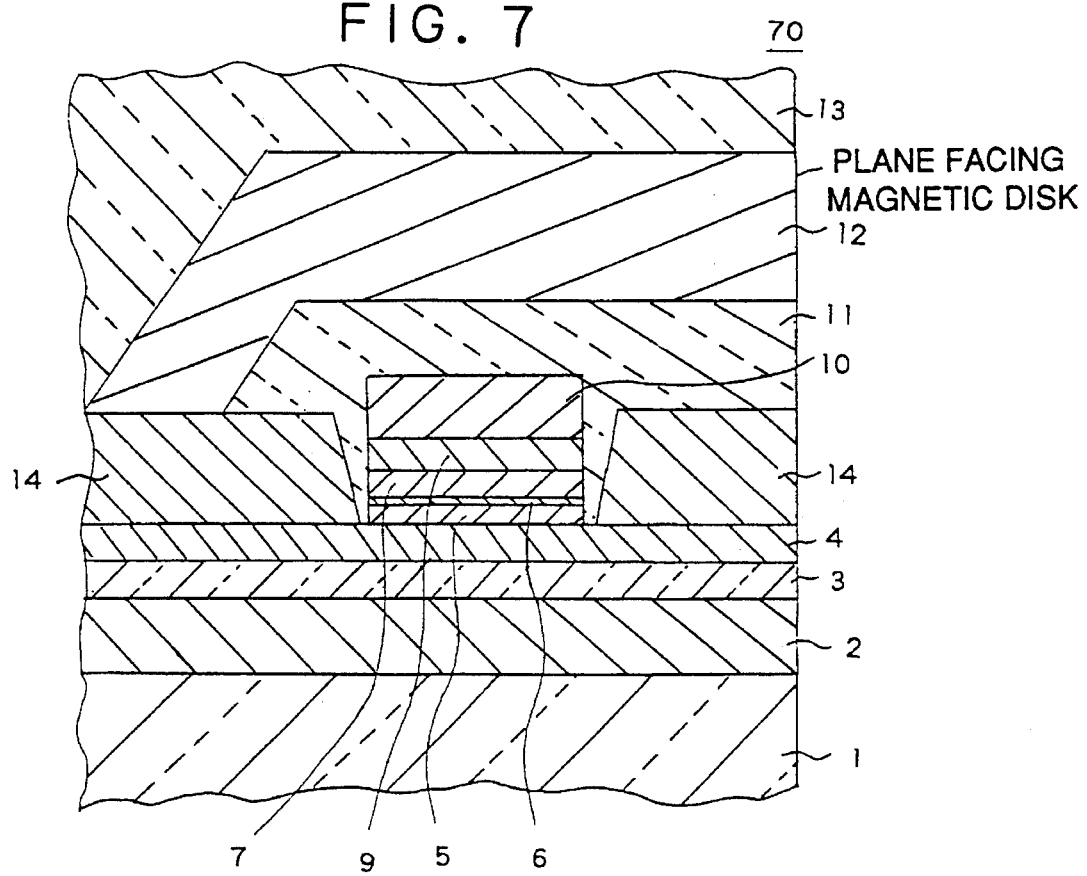
FIG. 7 is a sectional view showing the film structure of a still another magnetic head that can be used with the magnetic recording and reproducing device in FIG. 2.

Although each of the magnetic heads 50 and 60 has the giant magnetoresistive element exposed to the plane facing the magnetic disk, the magnetic disk 70 in FIG. 7 has a giant magnetoresistive element (a first ferromagnetic film 5, a second ferromagnetic film 6, and a nonmagnetic film 6 placed therebetween) disposed distant from the plane facing the magnetic disk. A magnetic film 14 is formed between the giant magnetoresistive element and the plane facing the magnetic disk. An upper shield film 12 is in contact with the magnetic film 14, these two films defining a magnetic path. The giant magnetoresistive element is disposed along the magnetic path, providing a structure which causes less damage to the giant magnetoresistive element, even if the plane of the magnetic head facing the magnetic disk wears away. A protective film 13 is located on the upper shield film 12.

Since the film thickness of the first and second ferromagnetic films 5 and 7 and the nonmagnetic film 6 of the magnetic head 70 is 10 nm or less, the magnetic characteristic and the structure of the films may vary with wear or a change in the environment of the plane facing the magnetic media. The magnetoresistive head of the structure as shown in FIG. 7 is useful as one means of solving such a demerit.

Figure 9:
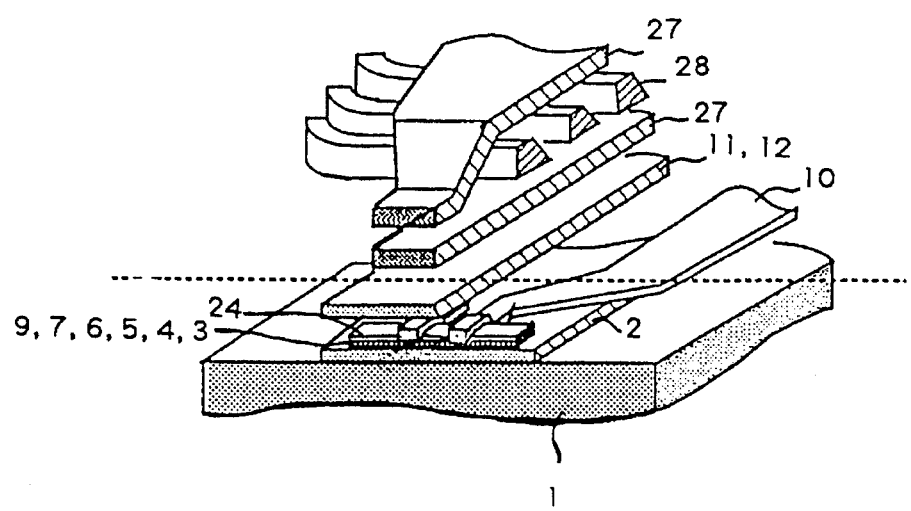
FIG. 9 is a fragmentary perspective view showing the film structure of a magnetic head that can be used with the magnetic recording and reproducing device in FIGS. 10A and 10B.

A magnetic head 80 using a giant magnetoresistive element according to still another embodiment of the invention will be described with reference to FIG. 9. The magnetic head 80 includes an inductive magnetic head for recording, and a magnetic head using a giant magnetoresistive film for reproducing. The head 80 comprises the inductive magnetic head consisting of a magnetic film 27 and a coil 28 laminated on the magnetic head using a giant magnetoresistive element having a similar structure to that of the magnetic head in FIG. 5. The giant magnetoresistive element is processed by ion milling and an electrode film is manufactured by a lift-off process.

Figure 10A:
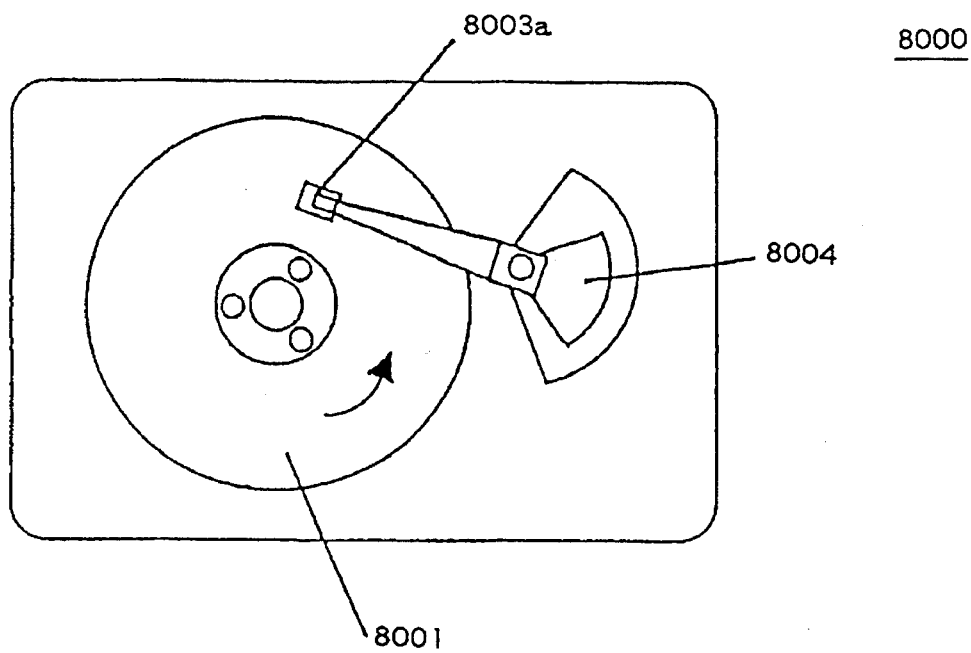
FIGS. 10A and 10B are illustrations showing the structure of a magnetic recording and reproducing device according to another embodiment of the invention.
Figure 10B:
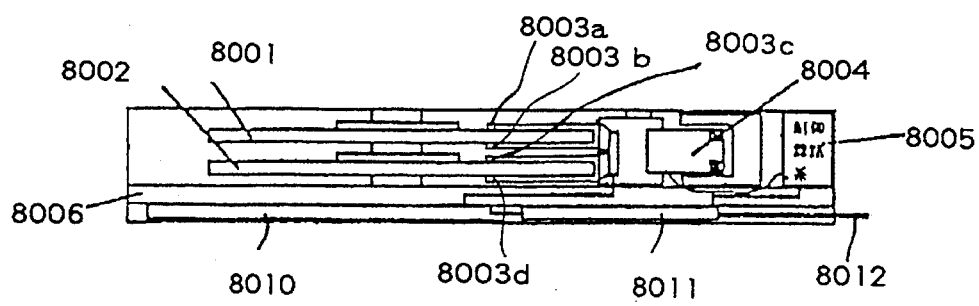

Next, a magnetic disk unit 8000 using the magnetic head in FIG. 9 will be described with reference to FIG. 10. The magnetic disk unit 8000 comprises two magnetic disks 8001 and 8002 on a base 8006 with a head drive and signal processor 8010 and an input/output interface 8011 integrated on the rear of the base 8006. The magnetic disk unit 8000 is connected to the outside by a 32-bit bus line 8012. Four heads shown in FIG. 9, 8003a, 8003b, 8003c, and 8003d, are disposed on both sides of the magnetic disks 8001 and 8002. A rotary actuator 8004 for driving the heads 8003a to 8003d, its drive and control circuit, and a motor directly connected to a spindle for disk rotation are mounted.

Each of the disks 9001 and 9002 is 46 mm in diameter and the area from a 10 mm diameter to a 40 mm diameter is used as a data face. Since an embedded servo system is used, and no servo face is provided, data can be recorded at high density. The magnetic disk unit can be directly connected as an external storage device of a small-sized computer. A cache memory is mounted on the input/output interface for supporting the bus line on which data is transferred at a transfer rate of 5–20 megabytes per second. An external controller is installed and a plurality of the magnetic disk units 8000 are connected in parallel, whereby a magnetic disk system having a large capacity can also be provided.

As described above, in the magnetic disk unit using the giant magnetoresistive element of the invention, the magnetization directions of the first and second ferromagnetic films when no external magnetic field is received are made non-orthogonal when no detection current is made to flow, and are made orthogonal to each other when detection current is made to flow, thereby raising the detection sensitivity, and thus providing high recording density.

In contrast, the reason why the detection sensitivity cannot be raised with the magnetic disk unit using the conventional giant magnetoresistive element is considered to be as follows:

In the magnetoresistance effect type sensor in European Patent 0490608A2, only a power supply and a sensing circuit are mounted on the electrode and determination of the current direction by considering the magnetization direction is only described with respect to a current made to flow into the giant magnetoresistive element. A circuit for setting the optimum value of the current density is not provided and the fact that the output characteristic changes with the current density is not described, because it is considered that the inventors of the EP0490608A2 did not aim at the effect of a magnetic field produced by an electric current.

The magnetic head 50 using the magnetoresistive film in the embodiment described above enables a track width to be manufactured easily at high accuracy.

In contrast, the reason why track width accuracy was bad with the magnetic disk unit using the conventional giant magnetoresistive film is considered to be as follows:

In the magnetoresistance effect type sensor in European Patent 0490608A2, a ferromagnetic film is formed between a magnetic film and an antiferromagnetic film having high coercive force on both ends. In this structure, a magnetoresistive film must be patterned to predetermined dimensions with a first ferromagnetic film left, before a magnetic film and antiferromagnetic film having high coercive force are formed on the first ferromagnetic film. Therefore, it is necessary to clean the surface of the first ferromagnetic film and the ends of a metal layer and a second ferromagnetic film in the magnetoresistive film contaminated by oxide, etc., by some method. However, cleaning the oxide film on the ends of the metal film and the second ferromagnetic film makes the track width accuracy bad, and cleaning the ends is a complicated process. Further, since their film thickness is thin, there is a fear that damage to the second ferromagnetic film, the metal film, and the antiferromagnetic film will be caused by cleaning. As a result, the magnetic characteristic of the magnetoresistive film is impaired. Although there is no problem if the degree of the end cleaning is constant, if it changes, the track width accuracy becomes bad and the output characteristic also varies. If the cleaning is insufficient, the track width varies depending on the oxidation degree and output changes. Therefore, the conventional magnetic head is not suitable for a magnetic head to be used for high-density magnetic recording.

Thus, according to the invention, the magnetic recording and reproducing device using the magnetoresistive film having high detection sensitivity can be provided by adopting the structure considering a coupling magnetic field produced by a detection current.

What is claimed is:

1. A method of detecting an external magnetic field using a giant magnetoresistive film comprising a conductive nonmagnetic film, first and second conductive ferromagnetic films placed with said nonmagnetic film between, a magnetization fixing film being magnetically coupled to said first ferromagnetic film for fixing a magnetization direction of said first ferromagnetic film, and a pair of electrodes for making a detection current flow into said first and second ferromagnetic films and said nonmagnetic film, said method comprising the steps of:

providing a giant magnetoresistive film having the magnetization direction of said second ferromagnetic film previously formed so that the magnetization directions of said first and second ferromagnetic films are substantially non-orthogonal when said giant magnetoresistive film does not receive an external magnetic field and does not make detection current flow;

supplying between said pair of electrodes a detection current for generating a magnetic field of a certain magnitude for causing the magnetization directions of said first and second ferromagnetic films to be substantially orthogonal to each other when said giant magnetoresistive film does not receive an external magnetic field and makes detection current flow; and using the detection current to detect a change in electrical resistance of said giant magnetoresistive film caused by an external magnetic field for detecting the external magnetic field.

2. A magnetic recording and reproducing device comprising a magnetic head using a giant magnetoresistive film, means for holding a magnetic disk, drive means for rotating the magnetic disk, and current supply means for supplying a detection current to the magnetic head for detecting electrical resistance of the giant magnetoresistive film, said giant magnetoresistive film comprising a conductive nonmagnetic film, first and second conductive ferromagnetic films placed with said nonmagnetic film between, a magnetization fixing film being magnetically coupled to said first ferromagnetic film for fixing a magnetization direction of said first ferromagnetic film, and a pair of electrodes for making a detection current supplied from said current supply means flow into said first and second ferromagnetic films and said nonmagnetic film, wherein when no external magnetic field of the magnetic disk is received and no detection current flows, a magnetization direction of said second ferromagnetic film is substantially non-orthogonal to the magnetization direction of said first ferromagnetic film, said current supply means has current strength setting means for determining a magnitude of the detection current;

said current strength setting means determines the magnitude of the detection current so that a magnetic field of the detection current flowing into said giant magnetoresistive film is set to a certain magnitude so as to cause the magnetization direction of said second ferromagnetic film, when the magnetic field of the magnetic disk is not received to be substantially orthogonal to the magnetization direction of said first ferromagnetic film.

3. The magnetic recording and reproducing device as claimed in claim 2 wherein when no external magnetic field of the magnetic disk is received and no detection current flows, the magnetization direction of said second ferromagnetic film has components parallel to the magnetization direction of said first ferromagnetic film, and wherein magnetic coupling between said first and second ferromagnetic films by the parallel components is 1 Oe or more.

4. The magnetic recording and reproducing device as claimed in claim 2 wherein when no external magnetic field of the magnetic disk is received and no detection current flows, the magnetization direction of said second ferromagnetic film has components antiparallel to the magnetization direction of said first ferromagnetic film, and wherein magnetic coupling between said first and second ferromagnetic films by the antiparallel components is 1 Oe or more.

5. The magnetic recording and reproducing device as claimed in claim 2 further comprising:

a pair of conductive antiferromagnetic films for controlling the second conductive ferromagnetic film; and an insulating film for defining a track width, said pair of conductive antiferromagnetic films being formed on the second conductive ferromagnetic film, said insulating film being formed between said pair of conductive antiferromagnetic films, one of said pair of electrodes being formed on one of said pair of conductive antiferromagnetic films, the other one of said pair of electrodes being formed on the other one of said pair of conductive antiferromagnetic films, and said insulating film having a thickness that is thinner than each of said electrodes.

6. The magnetic recording and reproducing device as claimed in claim 2 further comprising:

a pair of conductive antiferromagnetic films for controlling the second conductive ferromagnetic film; and an insulating film for defining a track width, said pair of conductive antiferromagnetic films being formed on the second conductive ferromagnetic film, said insulating film being formed between said pair of conductive antiferromagnetic films, one of said pair of electrodes being formed on one of said pair of conductive antiferromagnetic films, the other one of said pair of electrodes being formed on the other one of said pair of conductive antiferromagnetic films, and said insulating film having a thickness that is thinner than that of each of said conductive antiferromagnetic films.

\* \* \* \* \*